United States Patent
Rose

(10) Patent No.: US 7,151,330 B2
(45) Date of Patent: Dec. 19, 2006

(54) APPARATUS AND METHOD FOR GENERATING HIGH VOLTAGES USING A VOLTAGE INVERSION GENERATOR AND MULTIPLE CLOSED-PATH FERRITES

(75) Inventor: Millard Franklin Rose, Auburn, AL (US)

(73) Assignee: Radiance Technologies, Inc., Huntsville, AL (US)

( * ) Notice: Subject to any disclaimer, the term of this patent is extended or adjusted under 35 U.S.C. 154(b) by 495 days.

(21) Appl. No.: 10/393,325

(22) Filed: Mar. 20, 2003

(65) Prior Publication Data

US 2006/0238034 A1    Oct. 26, 2006

(51) Int. Cl.
*H03K 3/00* (2006.01)
(52) U.S. Cl. ..................... 307/106; 307/108
(58) Field of Classification Search ............... 307/106, 307/108, 109
See application file for complete search history.

(56) References Cited

U.S. PATENT DOCUMENTS

| | | | |
|---|---|---|---|
| 2,919,390 A | 12/1959 | Grouse et al. | |
| 3,322,976 A | 5/1967 | Blank | |
| 3,475,620 A * | 10/1969 | Edmonds et al. | 361/4 |
| 3,681,604 A * | 8/1972 | Criswell et al. | 378/106 |
| 3,710,211 A | 1/1973 | Behn et al. | |
| 4,140,917 A * | 2/1979 | Weiner | 307/106 |
| 4,198,590 A * | 4/1980 | Harris | 315/335 |
| 4,217,468 A | 8/1980 | Rice et al. | |
| 4,379,982 A | 4/1983 | Proud | |
| 4,484,085 A | 11/1984 | Fallier et al. | |
| 4,507,567 A | 3/1985 | Lawson | |
| 4,608,521 A | 8/1986 | Fallier et al. | |
| 4,680,509 A * | 7/1987 | Fallier et al. | 315/290 |
| 4,717,834 A | 1/1988 | Levy | |
| 4,724,362 A * | 2/1988 | Lester | 315/289 |
| 4,803,378 A | 2/1989 | Richardson | |
| 4,818,892 A | 4/1989 | Oohashi et al. | |
| 4,996,495 A | 2/1991 | Birx | |
| 5,118,969 A | 6/1992 | Ikezi | |
| 5,567,995 A | 10/1996 | O'Laughlin et al. | |
| 5,666,089 A * | 9/1997 | Ehlers | 333/81 R |
| 6,879,457 B1 * | 4/2005 | Eaton et al. | 360/75 |

OTHER PUBLICATIONS

Brau, C.A.; Raybun, J.L.; Dodge, J.B.; Gilman, F.M.; Simple, pulsed, electron beam gun, Rev. Sci. Instrum., vol. 48, No. 9, Sep. 1977, pp. 1154-1160, American Institute of Physics 1977.

Ramrus, A.; Rose, F.; High-Voltage Spiral Generators, Nov. 9, 10, 11, 1976, Proceedings IEEE International Pulsed Power Conference.

Rühl, F.; Herziger, G.; Analysis of the spiral generator, Rev. Sci. Instrum. 51(11), Nov. 1980, pp. 1541-1547, American Institute of Physics 1980.

(Continued)

*Primary Examiner*—Robert L. Deberadinis
*Assistant Examiner*—Daniel Cavallari
(74) *Attorney, Agent, or Firm*—Thomas, Kayden, Horstemeyer & Risley, L.L.P.

(57) ABSTRACT

A vector inversion generator utilizes closed-path ferrites to modify the characteristics of the generator. The closed-path ferrites increase an inductance within a portion of the generator and additionally provide a protective shield for associated electronic circuits. By increasing the inductance, the closed-path ferrites increase the voltage efficiency and the energy efficiency of the generator.

18 Claims, 13 Drawing Sheets

OTHER PUBLICATIONS

Lester, James N.; Proud, Joseph M.; Fallier, Charles N.; Starting HID Lamps with Spiral Line Pulse Generators, 1987 Journal of the Illuminating Engineering Society, pp. 72-80.

Kolleck, Christian, Mrozynski, Gerd; Guided Waves in a Spiral Line Pulse Generator, 1996 Asia Pacific Microwave Conference, pp. 1289-1292.

Bulatov, M.U.; Toropov, B.K.; Filippov, V.G.; Chernov, E.N.; Generator of High-Voltage Rectangular Pulses, pp. 1589-1591, vol. 22, No. 6, part 2, Nov. Dec. 1979 Instruments and Experimental Techniques.

Gerasimov, A.B.; Roife, I.M.; Seredenko, E.B.; Stekol'nikov, B.A.; Helical Pulse-Voltage Generator, pp. 819-821, No. 3 Instruments and Experimental Techniques, May Jun. 1970.

Kozlov, M.I.; A High-Voltage Pulse Generator, vol. 16, No. 5, Part 1, Instruments and Experimental Techniques, Sep.-Oct. 1973.

Kozlov, M.I.; Volkov, S.V.; Golobokin, G.K.; Increase of the Output Voltage Pulse Generators of the Spiral Type, pp. 1443-1444, 1976 Plenum Publishing Corporation.

Avdienko, A.A.; Bulushev, A.F.; Grishanov, B.I.; Matveev, Yu. G.; Powerful High-Voltage Nanosecond Pulse Generator, pp. 470-472, vol. 20, No. 2, Part 1, Instruments and Experimental Techniques, Mar.-Apr. 1977.

* cited by examiner

FIG. 6  Increased peak from 8.3 kV with no ferrites to 12.3 kV with 3 ferrites

| Number of Ferrites | High Frequency | Low Frequency | Ratio (High/Low) |
|---|---|---|---|
| 0 | 5.68 MHz | 2.94 MHz | 1.93 |
| 1 | 5.68 MHz | 1.43 MHz | 3.97 |
| 2 | 5.68 MHz | 1.0 MHz | 5.68 |
| 3 | 5.68 MHz | 0.88 MHz | 6.45 |
| 4 | 5.68 MHz | 0.84 MHz | 6.76 |

9.5" Diameter Spiral
Frequency varied from 10 to 25 Mhz by adjusting lead length
Short Loop - 25 MHz
Long Loop - 10 MHz Efficiency of a VIG(1).
$\tau$ is the two way transit time for the propagating wave in the VIG. $\tau_S$ is the switch e-folding time as the switch impedance collapses. $\beta_1$ is the contribution to the efficiency factor $\beta$ due to the switch.

211

| Switch | Voltage KV | I Max Ka | dI/dt KA/ms | Life Hz | Comments |
|---|---|---|---|---|---|
| Spark Gap | >50 | >1000 | >1000 | <10$^6$ rep 50Hz | Limited Life Acceptable |
| Pseudo Spark Switch | 35 | 20 | >20 | <10$^9$ rep 500Hz | Acceptable |
| PCSS | 10-200 | 8 | ~104 | ~10$^8$ | Acceptable With Long Life |
| Dielectric Puncture Switch | >50 | >1000 | >1000 | Single Shot | Switch of Choice for Single Shot Applications |
| Si-Thyristor | 4 | >10 | 10 | >10$^6$ | Radar Modulators, Acceptable for some applications |

| Material | Relative Permeability $\varepsilon_r$ | Max. Electric Field EV/mil | Comments |
|---|---|---|---|
| Kapton (Polyamide) | 3.6 | 7000 | Widely Available |
| Oil Impregnated Kraft Paper | 6 | 2000 | Properties depend on impregnate |
| Polycarbonate | 2.7 | 7000 | Widely Available |
| Polyethylene | 2.2 | 4500 | Widely Available |
| Polypropylene | 2.5 | 9600 | Widely Available |
| Polysulfone | 3.1 | 8000 | Widely Available |
| Polyvinylidine difluoride TPL | 8-11 | >5000 | Experimental |
| Teflon | 2.1 | 5000 | Widely Available. Excellent High Frequency Properties |

FIG. 12

Cross Section
for N=2

APPARATUS AND METHOD FOR GENERATING HIGH VOLTAGES USING A VOLTAGE INVERSION GENERATOR AND MULTIPLE CLOSED-PATH FERRITES

RESEARCH OR DEVELOPMENT

The U.S. government has a paid-up license in this invention and the right in limited circumstances to require the patent owner to license others on reasonable terms as provided for by the terms of DASG60-02-P-0018 awarded by the U.S. Army Space and Missile Defense Command of the U.S. and NAS8-01149 awarded by the National Aeronautics and Space Administration of the U.S.

BACKGROUND OF THE INVENTION

1. Field of the Invention

This invention generally relates to pulse generators for generating high-voltage pulses and, more particularly, to vector inversion generators that operate on the principle of combining inverted electric field vectors with static electric field vectors.

2. Related Art

Various high-voltage sources are available to generate high-voltage pulses that are utilized for the operation of high-voltage devices, such as, pulse radar, X-ray machines and the like. A conventional vector inversion generator (VIG) is one such high-voltage source suitable for supplying high-voltage pulses to a variety of high-voltage devices. The VIG is structured similar to a two-layer spiral wound capacitor and functions as two parallel plate transmission lines sharing a common conductor. The VIG has a capacitance that receives a charge from a voltage source connected to a terminal pair of the VIG and after the capacitor is fully charged, the voltage source is replaced by a short circuit. The short circuit causes, after a time delay, a high-voltage pulse to appear on an output terminal pair of the VIG. The plates of the capacitor function as two transmission lines with the first transmission line (often referred to as the active transmission line) reflecting a time varying electrical field and combining the resulting inverted electric field vector with a relatively slowly decaying electric field on the second transmission line (often referred to as the static transmission line).

Conventional vector inversion generators are made by winding several layers of a VIG fabric ("fabric") about a circular core in a manner similar to winding ribbon on a cylinder. The circular core may have a variety of diameters and lengths, and the fabric is typically comprised of alternate layers of foil-like conductors such as copper or aluminum and dielectrics such as Mylar or Teflon. The foil-like conductor is preferably shim stock, a type of foil that has consistent dimensions and electrical characteristics. A variety of dielectrics may be used and such dielectrics typically have a relative dielectric constant (permittivity) greater than two.

Most conventional VIGs use a fabric comprised of two alternating layers of conductor and dielectric. Each layer of dielectric is typically comprised of multiple sheets of dielectric material to minimize the chance of breakdown due to pin holes that sometimes occur in a dielectric material. The fabric is usually wound about a cylindrical core two to ten or more times. The diameter of the cylindrical core is usually significantly greater than the total thickness of all the layers of the wound fabric. The fabric has a first end, the inside end of the spiral, and a second end, the outside end of the spiral.

Two transmission lines are formed by the wound fabric, and the transmission lines have a common conductor. FIGS. 1A and 1B illustrate the wound fabric and the two transmission lines. The dielectric layers between the conductors, as shown in FIG. 1, form a capacitor that is capable of storing energy in an electric field in accordance with the well-known capacitance energy storage theory.

When a source voltage is applied to a conductor pair at the first end of the conventional VIG, the capacitance of the generator starts to charge and will reach full charge in accordance with the time constants of the charging circuit. Once the generator's capacitor is fully charged, the conventional VIG has energy stored in electric fields of the dielectric materials. The capacitance of the capacitor may be determined using well-known capacitance relations. The amount of energy stored, $E_{stored}$, may be determined by using the electrical relationship, $$E_{stored} = \frac{1}{2} \cdot C_T V^2.$$

After the capacitor is fully charged by the source voltage, the source voltage is effectively replaced by a short circuit. The short circuit causes a time varying electric field to propagate from the origin of the short circuit, the first end of the VIG, to the second end or far end of the VIG in accordance with transmission line theory. A reflected electrical field wave, from the far end, then returns toward the first end, inverting the polarity of the initial electric field vector. The return wave, when added to the relatively static electrical field of the second transmission line, provides a voltage that, ideally, is 2N times the source voltage. Because the voltage increases by a factor of 2N, the value for the new equivalent capacitance is equal to the previous capacitance divided by $(2N)^2$ thereby satisfying the conservation of energy principle.

Much of the current research pertaining to conventional VIGs is directed towards properties of materials and the diameter to turns ratios of such generators. For example, the diameter of the spiral, the number of turns of fabric, the dielectric values and thickness of the dielectrics, the conductivity and thickness of the conductors, and the number of layers (2 or more) are some of the design parameters. The voltage efficiency and energy efficiency are important consideration when selecting values for the design parameters. Designers must also consider limitations due to corona discharge, which occurs when voltages get too high.

Among the shortcomings associated with the conventional VIG is their size and weight. Because a large diameter is often desirable, to improve efficiency, for the conventional VIG, such a device may be undesirably large for certain applications. For some applications of the conventional VIG, it may be necessary or desirable to place the VIG in an enclosure containing non-conducting oil or potting material, thereby improving performance, but with the disadvantage of sometimes making such a device unacceptably heavy. Further, it is impractical to change the electrical characteristics of a conventional VIG after it has been fabricated. For example, when a VIG is fabricated, the number of fabric turns, the characteristics of the conductors and dielectrics, and the dimensions are fixed making such parameters essentially permanent, thereby making changes impractical. In order to change the parameters and characteristics of a conventional VIG, it is necessary to fabricate a new device.

SUMMARY OF THE INVENTION

The present invention generally pertains to an apparatus, system and method for generating a high-voltage pulse.

An exemplary apparatus in accordance with one embodiment of the present invention comprises a vector inversion generator having a capacitance where the generator comprises windings of layers of conductors and dielectrics, the generator further has a low-voltage port and a high-voltage port. The apparatus has one or more closed-path ferrites surrounding the layers of conductors and dielectrics for improving the efficiency of the generator. A supply voltage is coupled to the low-voltage port and a switch replaces the voltage source with a short circuit when the capacitance of the generator is charged. A load is coupled to the high-voltage port for receiving the high-voltage pulse.

It is to be understood that both the foregoing general description and the following detailed description are merely exemplary of the invention, and are intended to provide an overview or framework for understanding the nature and character of the invention as it is claimed. The accompanying drawings are included to provide further understanding of the invention, illustrate various embodiments of the invention, and together with the description serve to explain the principles and operation of the invention.

BRIEF DESCRIPTION OF THE DRAWING FIGURES

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the figures.

Figure 1A:
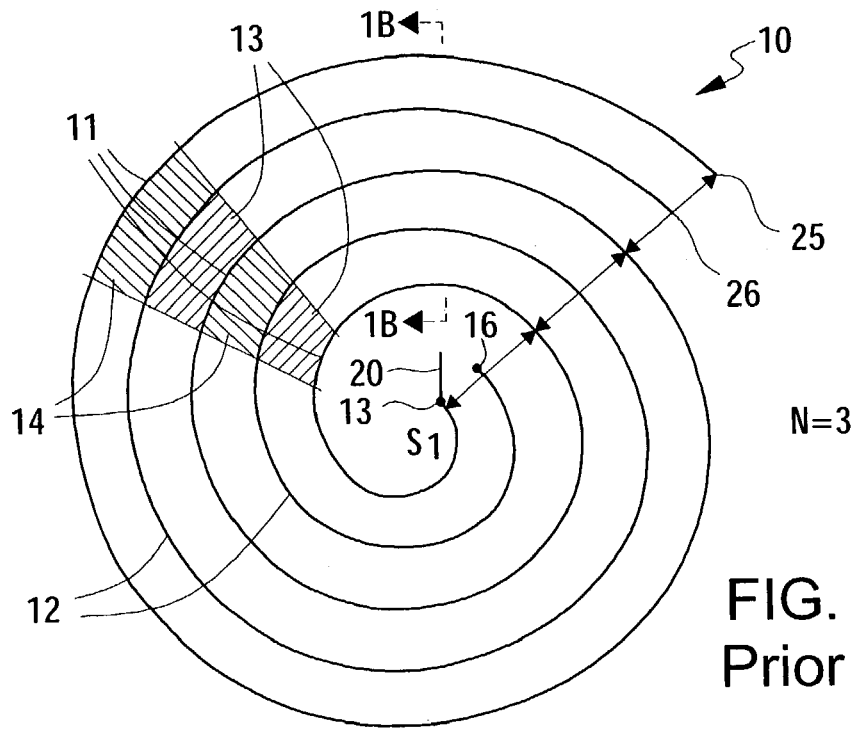
FIG. 1A, 1B illustrate a conventional vector inversion generator as the generator is being charged by a supply voltage.
Figure 1B:
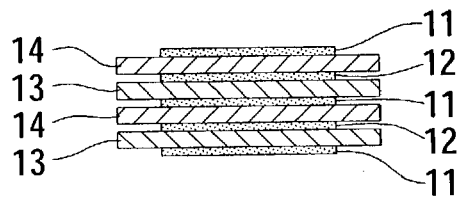
Figure 2:
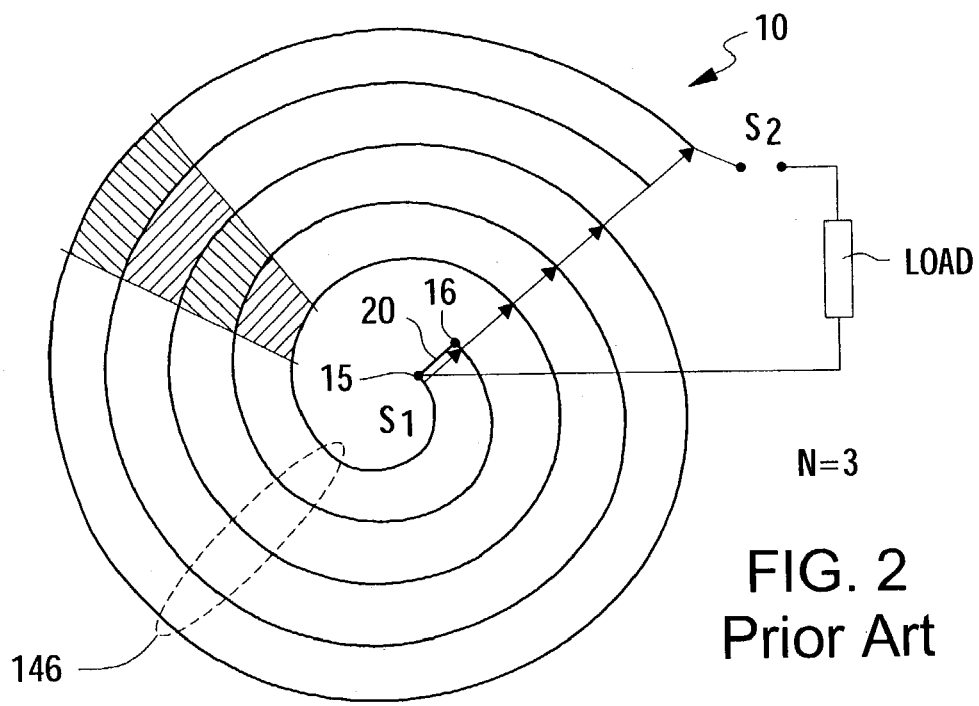
FIG. 2 illustrates the conventional spiral vector inversion generator of FIG. 1 in an output mode of operation and shows a switch for connecting a load to a high-voltage output port.

FIG. 5A, 5B, 5C, and 5D illustrate an exemplary placement of closed-path ferrites about the layers of conductors and insulators of the vector inversion generator of FIG. 1 and FIG. 2.

FIG. 6 is an illustration comparing the performance of the conventional vector inversion generator of FIG. 1 with the ferrite vector inversion generator of FIG. 5.

Figure 3:
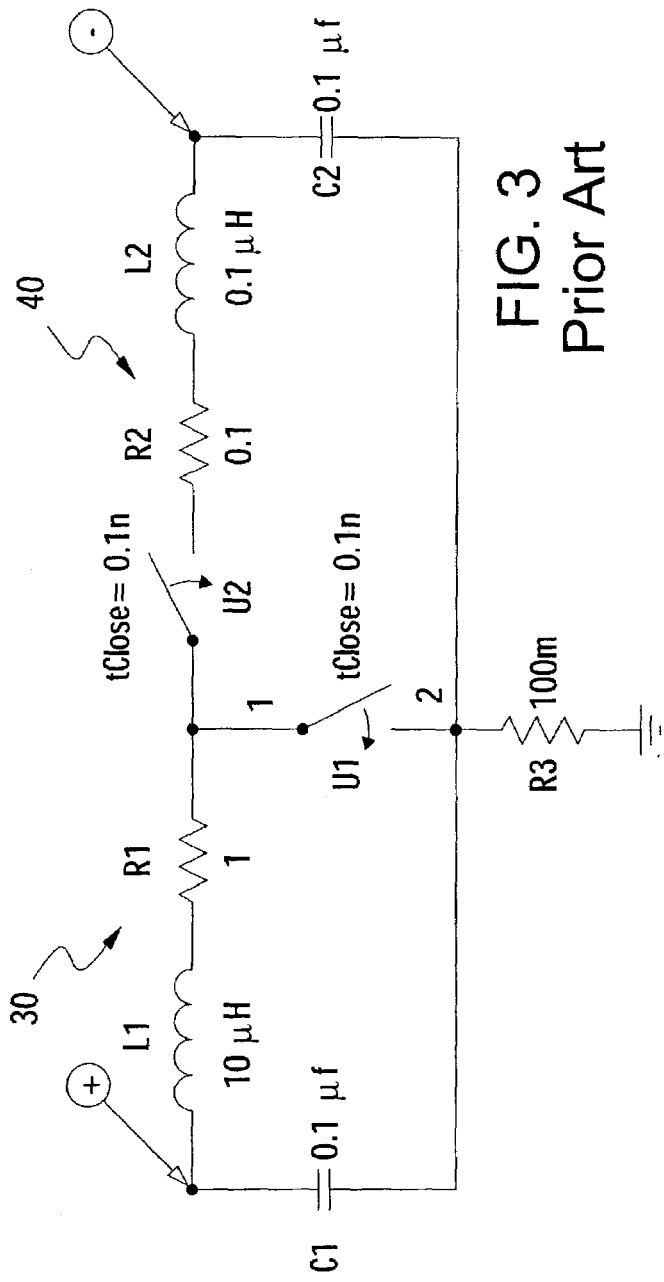
FIG. 3 is an initial state equivalent circuit representing the conventional vector inversion generator of FIG. 1 and FIG. 2 and the ferrite vector inversion generator of the present invention.
Figure 7:
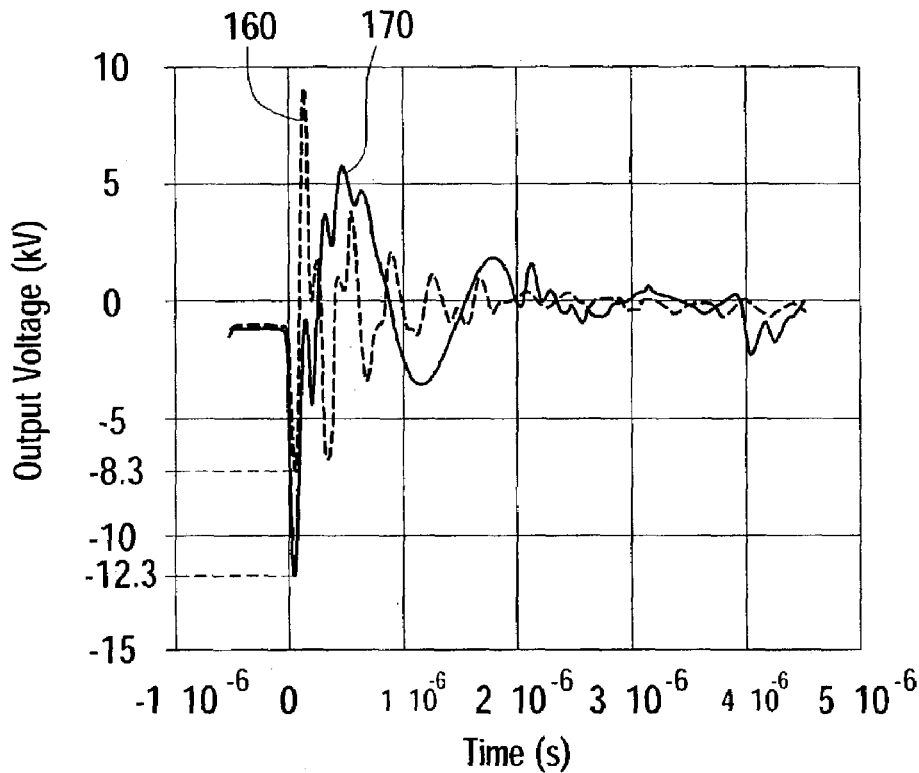

FIG. 7 illustrates the effects of adding closed-path ferrites to a conventional vector inversion generator has on the low-frequency circuit and high-frequency circuit shown in FIG. 3.

Figure 8:
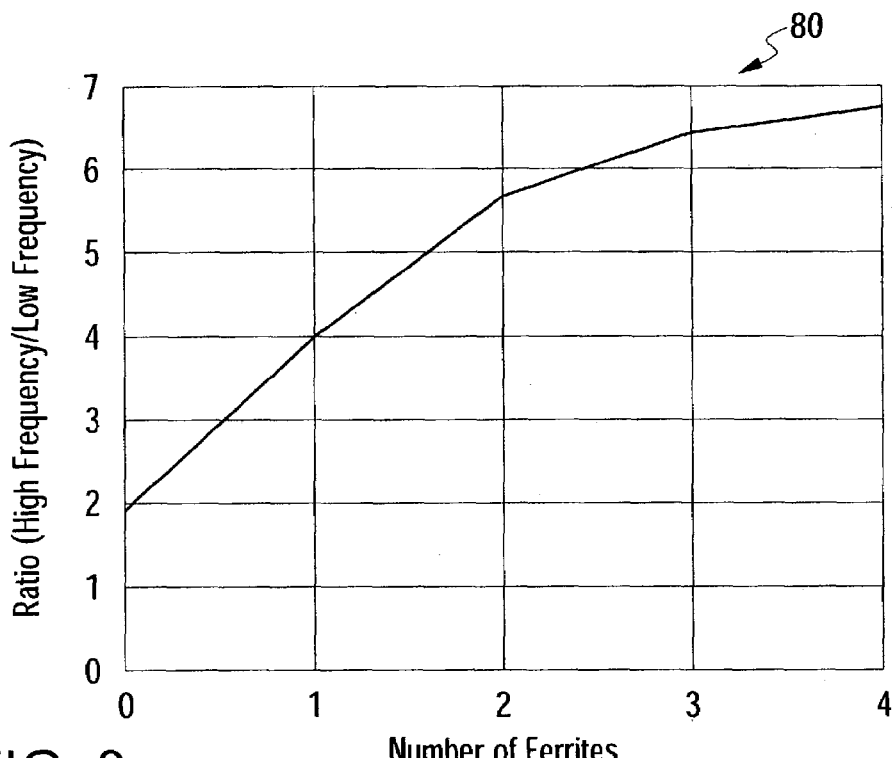

FIG. 8 graphically illustrates the frequency ratios as a function of the number of ferrites as shown in FIG. 7.

Figure 9:
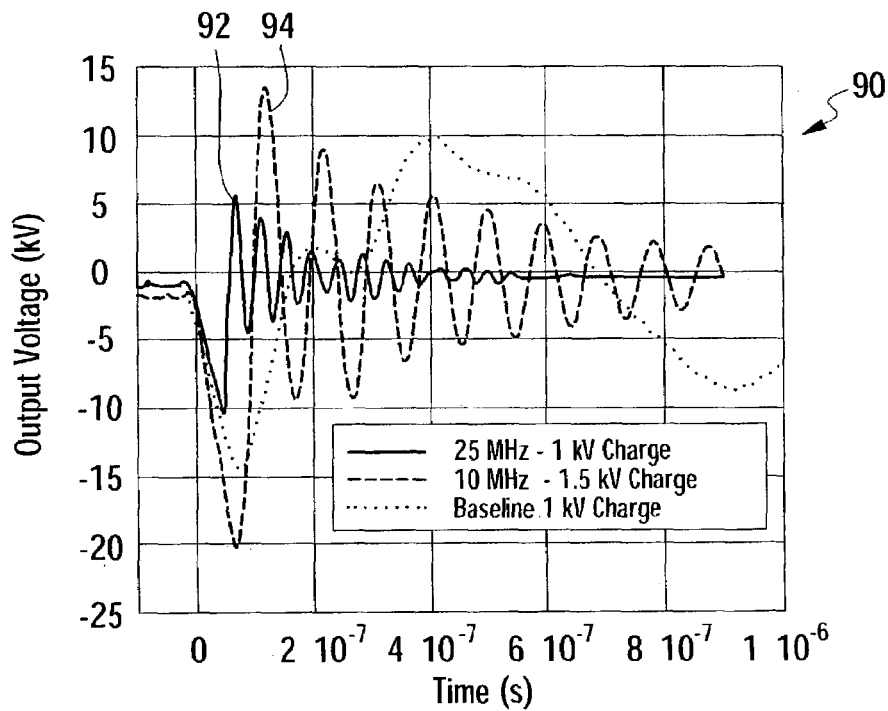

FIG. 9 illustrates how the length of leads at the high-voltage port may be used to modify the high-frequency output of the vector inversion generator of FIG. 2 or FIG. 5 when either is used as an oscillator.

Figure 10:
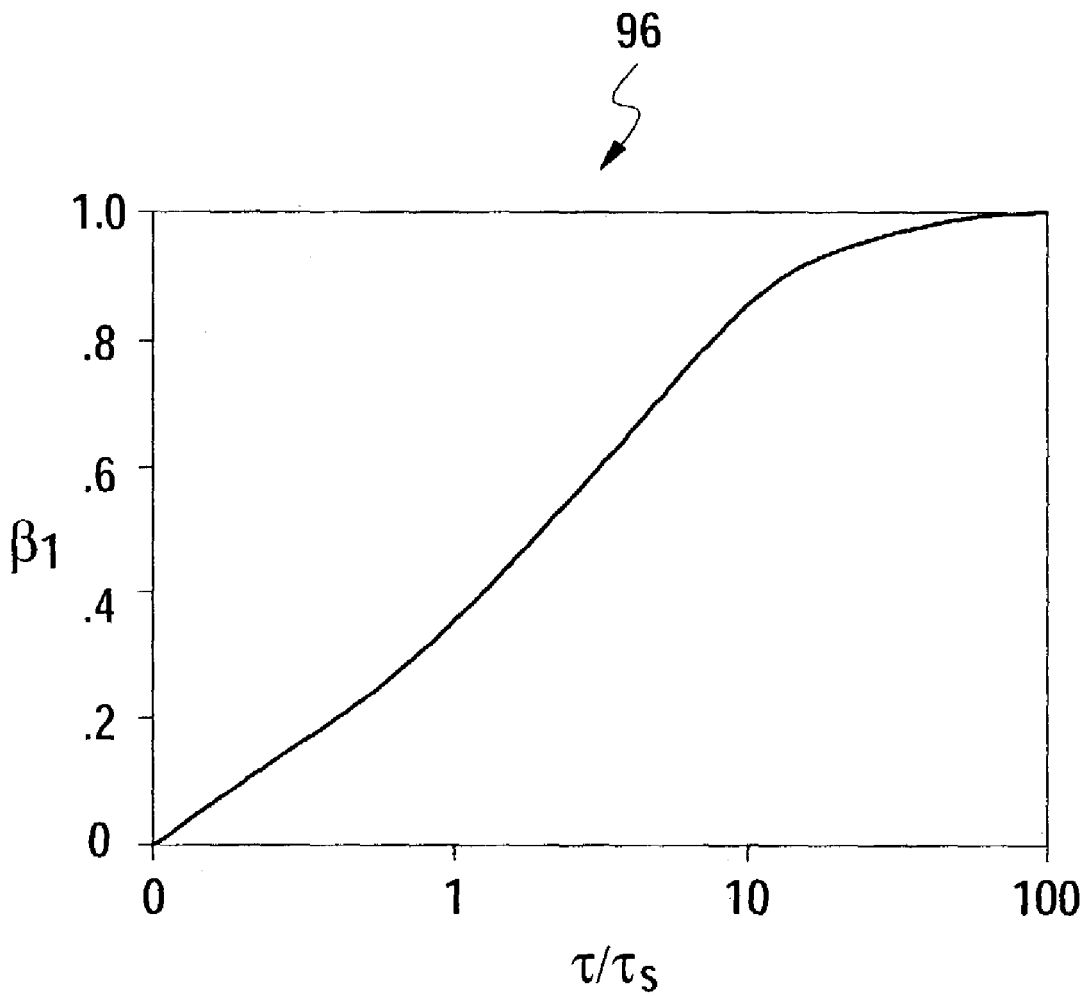

FIG. 10 illustrates variations in efficiency as a function of the ratio of two way transit time to the shorting switch e-folding time for the vector inversion generator of FIG. 2 or ferrite VIG of FIG. 5.

Figure 11:

FIG. 11 is a table illustrating examples of switches that may be used for providing the short circuit shown in FIG. 2 or FIG. 5.

FIG. 12 is a table illustrating examples of dielectric materials that may be used for insulation layers for the spiral generators of FIG. 1 and FIG. 5.

Figure 13A:
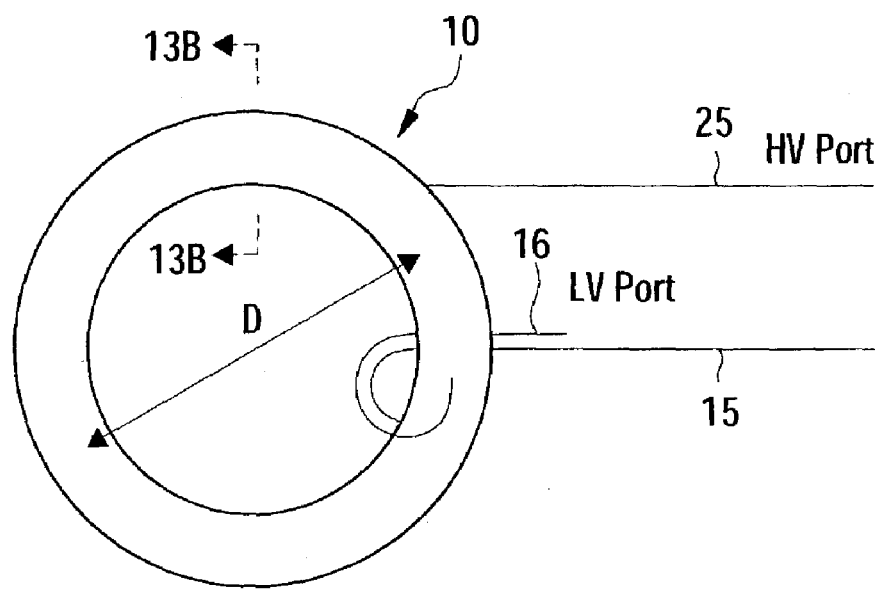

FIG. 13A, B is an illustration of a conventional vector inversion generator showing a cross section of the generator of FIG. 1.

Figure 14A:
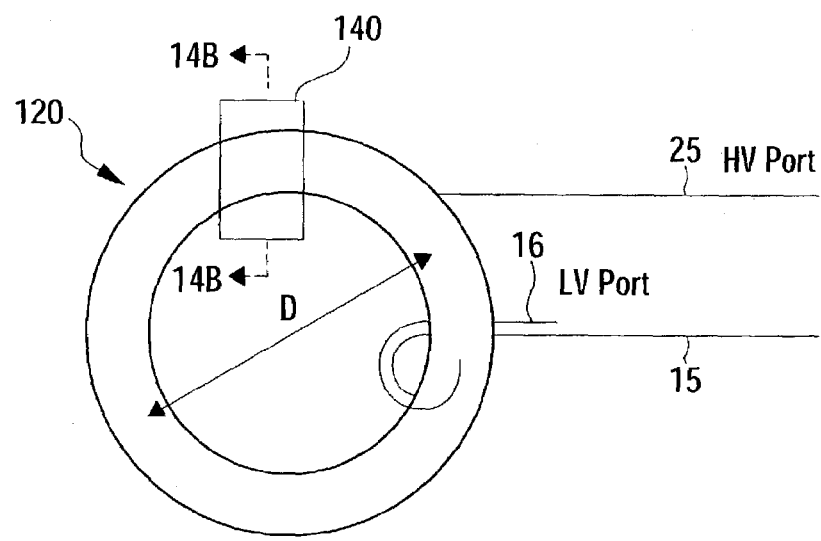

FIG. 14A, B is an illustration of a ferrite vector inversion generator in accordance with an exemplary embodiment of the present invention and shown in FIG. 5.

Figure 15A:
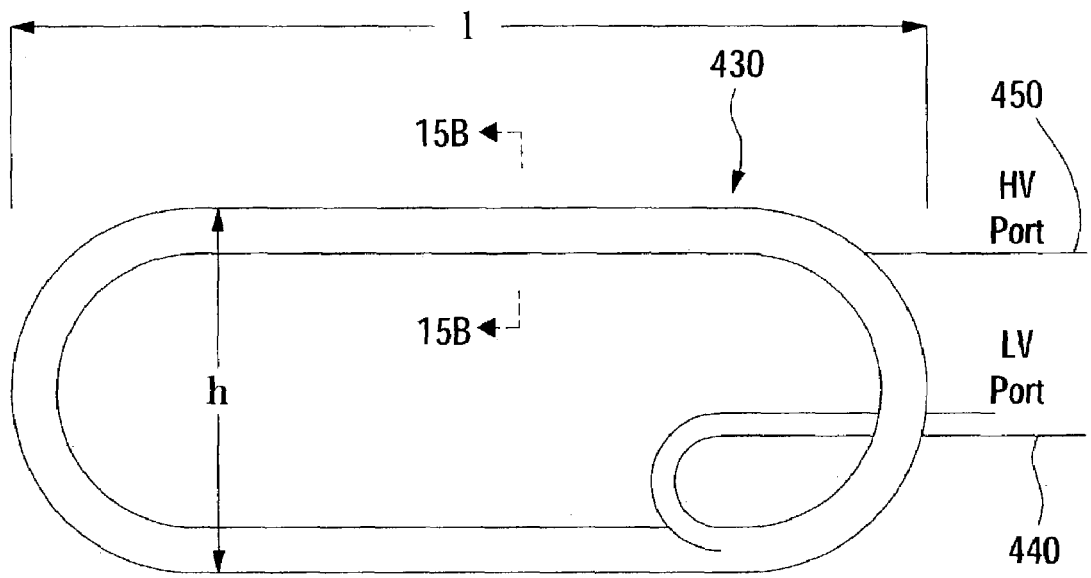

FIG. 15A, B is an illustration of a substantially planar vector inversion generator and a cross section of the planar vector inversion generator in accordance with an exemplary embodiment of the present invention.

Figure 16A:
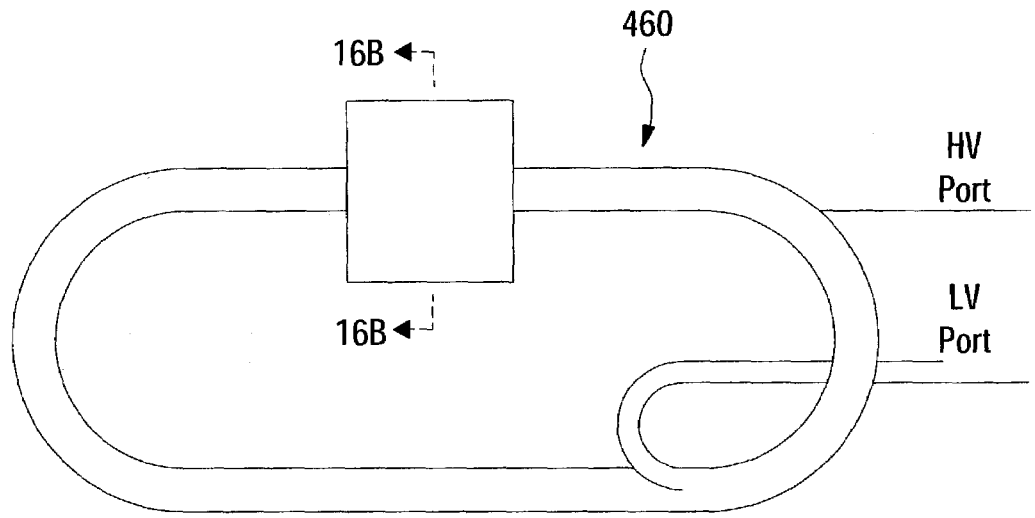

FIG. 16A, B is an illustration of a ferrite planar vector inversion generator in accordance with the present invention.

Figure 16B:
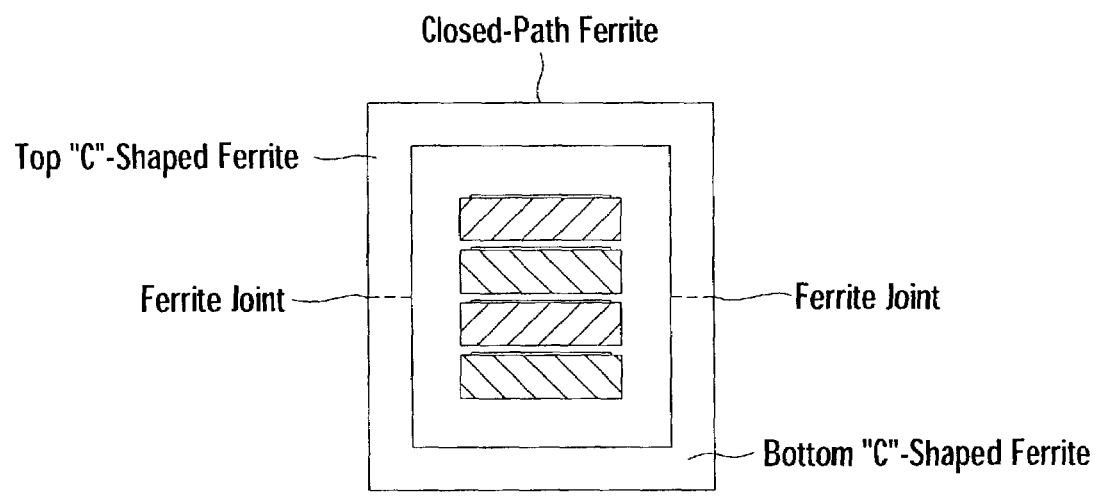
Figure 17:
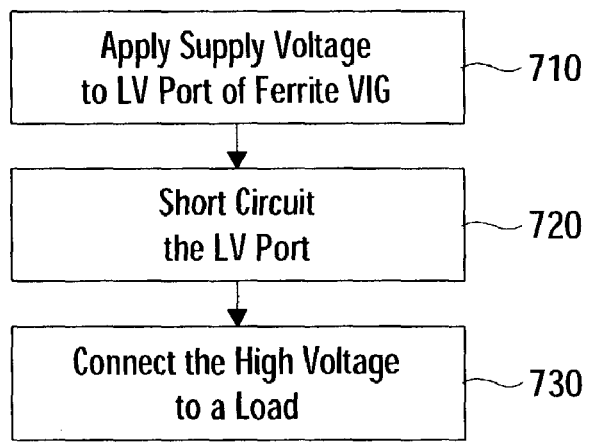

FIG. 17 is an exemplary method of operation for the ferrite vector inversion generators of FIGS. 14 and 16 in accordance with the present invention.

Figure 18:
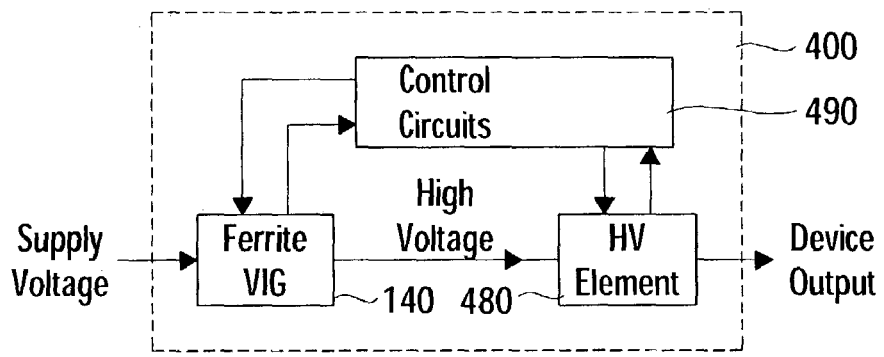

FIG. 18 is a block diagram illustrating the planar vector inversion generator of FIGS. 14 and 16 in accordance with an exemplary embodiment of the present invention.

Figure 19:
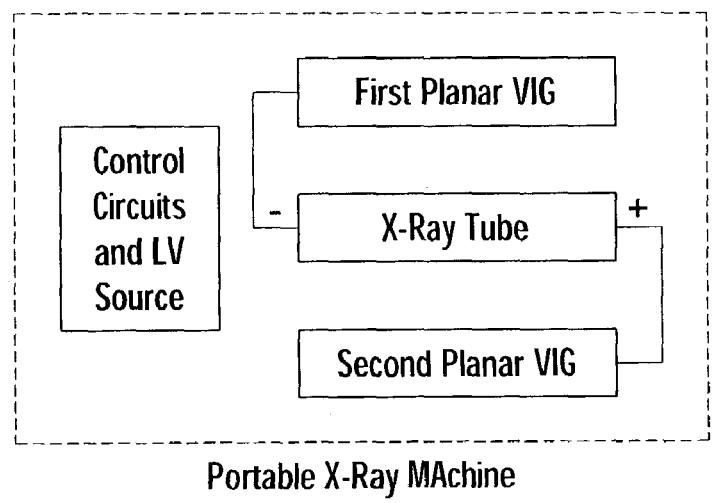

FIG. 19 is a block diagram of a portable X-ray device having power supplied by the ferrite planar vector generator of FIG. 16 in accordance with an exemplary embodiment of the present invention.

DETAILED DESCRIPTION

In general, the present invention provides an apparatus, method and system for generating high voltage pulses in accordance with the vector inversion generating principle. In one exemplary embodiment, a conventional vector inversion generator (VIG) has one or more closed-path ferrites surrounding the layers of conductors and insulators. In particular, a conventional VIG is fabricated and two C-shaped ferrites are preferably placed and secured about the layers of conductors and dielectrics to form a closed magnetic path surrounding the layers. The ends of the C-shaped ferrites, as will be seen, may be securely fastened together with clamps in order to minimize flux leakage from the closed ferrite path that contains the magnetic flux.

FIG. 1A depicts a conventional VIG 10 in a charging state wherein the capacitance of the VIG 10 receives a charge from a voltage source, $V_S$ (not shown). A first conductor 11 and a second conductor 12 are separated by a first dielectric 13 and a second dielectric 14 and the alternating layers are wound around, i.e. rolled about, an essentially circular core, thereby forming a spiral winding of alternating layers of conductors and dielectrics. A section view of the layers is shown in FIG. 1B and illustrates the dielectrics 13, 14 between the conductors 11, 12. In a method for fabricating the conventional VIG 10, flexible conductors and dielectrics are unrolled from spools and merged together as layers as a circular core or mandrel of the VIG is rotated. For example, a first spool of copper, aluminum or other conductor having ribbon-like characteristics (easily wound or unwound from the spool) preferably is used to form the first conductor 11.

A second spool (that may be two or more spools of dielectric material in order to minimize the effect of pin holes on breakdown) of Mylar, Teflon or other dielectric material is preferably used to form the first dielectric 13. Each of the dielectric layers typically are comprised of several sheets of dielectric material. A third spool is preferably used to form the second conductor 12, and a fourth spool (that may be two or more spools of dielectric) is preferably used to form the second dielectric 14. Those skilled in the art of making the conventional VIG 10 or a spiral capacitor would understand the details of the procedure for winding the layers of material about the circular core.

In some prior art designs, more than two alternating layers of conductors and dielectrics have been utilized. However, for most applications, two layers of conductors and two layers of dielectrics are utilized. The combined layers of materials may be designated as a VIG "fabric." A two-layer fabric comprises alternating layers of two conductors and two dielectrics. The thickness of conductors and dielectrics may vary and depend on a variety of design factors including voltage levels, cost, acceptable energy losses, diameter of the circular core, etc.

For the conventional VIG 10 to have consistent characteristics, the fabric should be wound tightly and uniformly about the circular core. Special purpose winding machines, designed to fabricate spiral wound capacitors, are typically utilized to fabricate the conventional VIG 10. However, for the fabrication of some conventional VIGs, it may be necessary or desirable to have a special machine for winding the fabric about the core. In order to reduce the chance of corona discharge and unwanted contact between the first and second conductors 11, 12, it is desirable for the widths of the dielectrics 13, 14, as seen in FIG. 1B, to be greater than the widths of the conductors thereby providing a protective overlap of dielectric at the edges. In some VIG fabrications the edges of the conductors may use edge grading, placing resistive material on the edges, to eliminate or reduce the production of ions. It should be noted that the illustration of FIG. 1A is not to scale so that there is the appearance that the mean (average) diameter of the spiral seems to be approximately one half of the maximum diameter for the conventional VIG 10. For many of the known uses of the conventional VIG 10, the mean diameter is much greater than the total thickness of all the layers of the fabric. For example, a typical conventional VIG 10 may have a mean diameter of six inches and have ten or more turns of a fabric such that the total thickness of all the layers of the fabric is less than one quarter of an inch. Hence a typical conventional VIG, from a relative dimensional perspective, may look similar to a short piece of a mailing tube.

The conventional VIG 10 is generally viewed, for analysis and design considerations, as two transmission lines of equal length having a common conductor. One of the transmission lines comprises the two conductors 11, 12 separated by the first dielectric 13 and is often referred to as the active transmission line. This active transmission line has one end, shown as inner ends 15, 16 inside the spiral, that is connected to a shorting switch 20 shown in an open position in FIG. 1 and in a closed position in FIG. 2. In another embodiment, the shorting switch 20, may be connected to outer ends 25, 26 on the outside of the spiral. The other transmission line comprises the two conductors 11, 12 separated by the second dielectric 14 and is often referred to as the passive transmission line. The active transmission line, during the operation of the conventional VIG 10, has a time varying electric field vector travelling back and forth between its near end (where the shorting switch 20 is typically located) and its far end as will be described below.

The ratio of the mean diameter, D, to the number of layers of fabric, N, is related to the voltage and energy efficiency of the conventional VIG 10. Hence, the value of D/N, sometimes called the diameter-to-turns ratio, is a parameter of merit that is typically considered when designing the conventional VIG 10. The conventional VIG 10 of FIGS. 1A and 2 has a value of N=3. Note that 2 turns of fabric provide 3 layers as seen in FIG. 1A between inner end 15 and outer end 25.

Still referring to FIG. 1A, there is shown the first inner (inside the spiral) end 15 of the first conductor 11 and the second inner end 16 of the second conductor 12. The ends 15, 16 typically have tabs of conductor material extending outwardly for making connections to the VIG 10. The shorting switch 20 of FIG. 1A, shown in the open position, is coupled to the tabs of the two inner ends 15, 16. Also connected to the inner conductors, but not shown, is a supply voltage, $V_S$. The supply voltage, $V_S$, provides energy for charging the capacitance of the VIG 10. The capacitance of the VIG (capacitor $C_{VIG}$) is formed by the layers of conductors and dielectrics. The directions of the electric field vectors of the fully charged VIG, shown by lines with arrows in FIG. 1A, may best be observed by starting at outer ends 25, 26 of the first conductor 11 and the second conductor 12. Additional electric field vector directions may be observed by traversing inward along a radius from outer ends 25, 26 toward the center of the spiral. The electric field vectors as shown in FIG. 1A represent the electric fields on the active transmission line (the vectors pointing inward) and the passive transmission line (the vectors pointing outward) before the shorting switch 20 is closed. Further it should be noted that before the shorting switch 20 is closed, the voltage between the first inner end 15 and the second outer end 26 is equal to the value of the supply voltage, $V_S$. An additional observation shows that the voltage between the first inner end 15 and the first outer end 25 is zero. When the shorting switch 20 is closed, assuming an ideal switch, the voltage across inner ends 16, 15 instantly goes from the value of $V_S$ to zero. In an alternative embodiment the supply voltage and shorting switch 20 may be connected across outer ends 25,26. The alternative embodiment thereby uses terminals 25, 26 as a low-voltage input port instead of using inner ends 15, 16. The high-voltage output, for the alternative embodiment, is available across inner end 15 and outer end 25.

After the shorting switch 20 is closed connecting inner ends 15 and 16, shown in FIG. 2, a time varying electric field vector travels from inner ends 15, 16 to the outer end 26 and returns. The time varying electric field travels at a phase velocity of around $2(10^8)$ meters per second in accordance to well-known principles of transmission line theory. As the time varying electric field vector is traversing the active transmission line of the conventional VIG 10, electric field polarity is changing and is completely reversed when the wave arrives back at the shorting switch 20. The phase velocity of the inverted vector may be found by dividing the speed of light in free space by the square root of the relative permittivity of the dielectric. The transition time, a round trip time, of the inverted vector is two times the length of the active transmission line divided by the phase velocity of the traveling electric field vector. After the inverted vector has made the out and back trip, the direction of the electrical field along the active transmission line (the line formed by the conductor pair connected across switch 20) has been reversed. Hence a new set of vectors exists on the conventional VIG 10 as shown in FIG. 2. The conventional VIG 10 is now in a fully erected state, shown by the direction of the electrical field vectors, and preferably has a high-voltage pulse available on high-voltage output port of the VIG, i.e., between outer end 25 and inner end 15. If, at this instant of time, the voltage were measured across the high-voltage port, a theoretical voltage equal to nearly six times the applied voltage may appear. The voltage available at the high-voltage port is a high-voltage pulse and may be applied to a variety high-voltage device such as, for example, a pulse-radar antenna, an X-ray tube or other device requiring a high-voltage source for operation. Because there are losses in the conductors 11, 12, dielectrics 13, 14, and the shorting switch 20 of the VIG 10, the voltage efficiency (the ratio of the maximum output voltage to the theoretical output voltage) typically has values between, for example, 20 and 70 percent. Hence, in the typical conventional VIG 10, an applied voltage of 1000 volts may provide a maximum output value of between 1200 and 4200 volts, instead of the theoretical 6000 volts for N=3. Details of design considerations to improve and control efficiency of the conventional VIG 10 are well known to those skilled in the art and will not be discussed in detail herein. Because the output voltage for the VIG 10, theoretically, may increase by a factor of 2N, for energy to be conserved the value of the capacitance for the erected device must be decreased. The erection capacitance, when the output voltage has its maximum value, changes by a factor of $(2N)^2$. For example, the erection capacitor, $C_o$, is one hundredth of the value of $C_{VIG}$ when N=5.

A simplified equivalent circuit 40 of a conventional VIG 10 in an initial state is shown in FIG. 3. The simplified equivalent circuit 40 is also used in discussions of the present invention shown in FIG. 5. The left side of the circuit having elements C1, L1 and R1 represents the passive transmission line 30 of the VIG 10. The passive transmission line may be identified in FIG. 1 as the pair of conductors separated by the second dielectric 14. The passive transmission line 30 is sometimes referred to as the slow side of the VIG 10. The oscillatory frequency of the slow side is inversely proportional to the square root of the product of L1 and C1, which, for the example values, is 0.159 MHz. The right side of the circuit, elements R2, L2 and C2, of FIG. 3 represents the active transmission line 40 of the VIG 10 that is often referred to as the fast side of the VIG. The active transmission line is identified in FIG. 1 as the two conductors separated by the first dielectric 13. As earlier described with reference to FIG. 2, the active transmission line 40 supports the travel of a time varying electric field vector. The active transmission line 40 has an oscillatory frequency dependent on L2 and C2, and for the example values of these components the frequency is ten times greater than the frequency of the passive transmission line 40. The circuit of FIG. 3 was developed for computer simulation of the VIG 10 of FIG. 1 and both switches U1 and U2 were needed to satisfy the requirements of the circuit modeling software.

Figure 4:
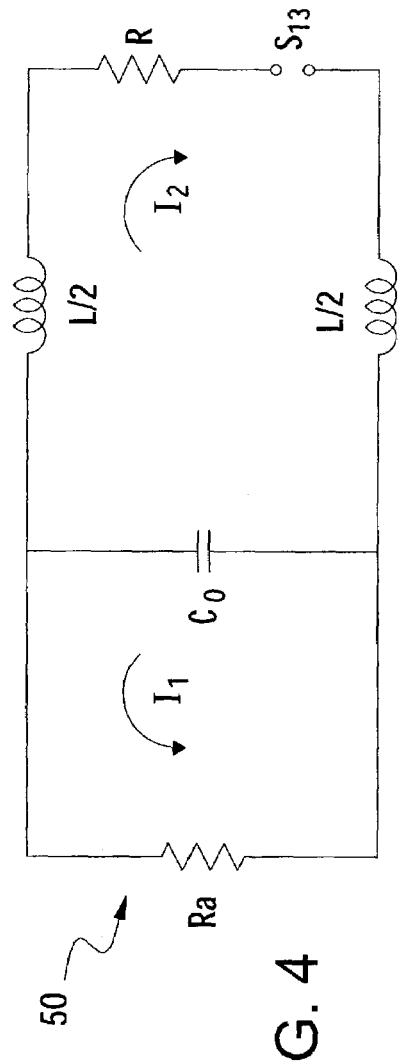
FIG. 4 illustrates an equivalent circuit that may represent the conventional spiral vector inversion generator of FIG. 1 and FIG. 2 or the ferrite vector inversion generator when in a fully erected state, is shorted with an output switch and connected to a parallel load such as an antenna or a radiating structure.

FIG. 4 illustrates a RF equivalent circuit of a RF source 50 utilized to provide energy to a load. The RF source comprises a VIG, such as shown in FIG. 2 or FIG. 5, and a high-voltage switch. The high-voltage switch is modeled as L (shown as two L/2 elements), R, and ideal switch $S_{13}$. The resistor $R_a$ represents a load, such as an antenna, attached across the high-voltage port of the VIG 10. The capacitor, $C_0$, is the erection capacitance, and has a value equal to $C_{VIG}$ divided by $(2N)^2$. The high-voltage switch is preferably an air gap device that closes when a high voltage appears across its terminals.

Figure 5A:
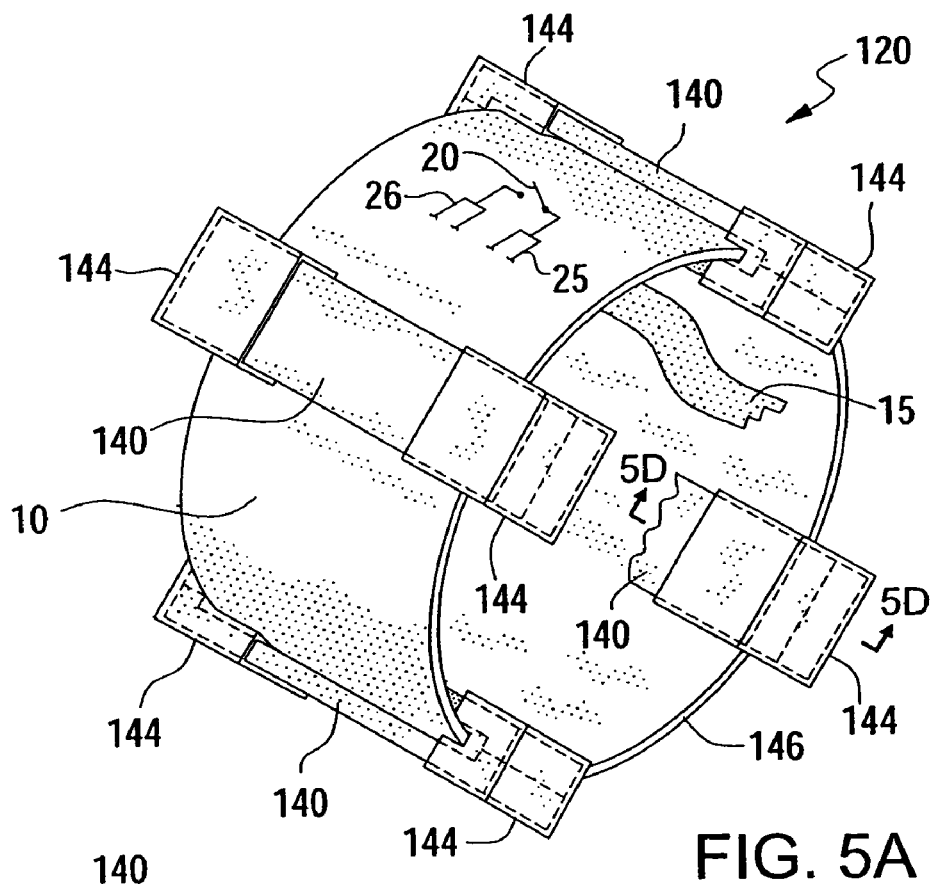

The description of the conventional spiral VIG 10 as illustrated in FIGS. 1–4 and discussed above provide an understanding of the fundamental principles of how such a device generates high-voltage pulses and may serve as element for an RF source. It has been discovered that, in accordance with the present invention, the parameters and characteristics of the passive transmission line 30 of a VIG 10 may be controlled by placing closed-path ferrites around the layers of conductors and insulators. Referring to FIG. 5A, there is shown a ferrite VIG 120 in accordance with an exemplary embodiment of the present invention. Closed-path ferrites 140 are securely attached with clamps 144 to surround the layers of conductors 11,12 and insulators 13, 14 of the conventional VIG 10. In the illustrated preferred embodiment, the outside ends 25, 26 of the conductor 11, 12 form the low-voltage input port for the ferrite VIG 120. The short circuit switch 20 of the embodiment shown in FIG. 5A is coupled between the outside ends 25, 26 and is located on the top of the ferrite VIG 120. The high-voltage output is available on a high-voltage port comprising the end 25 and end 15.

Figure 5B:
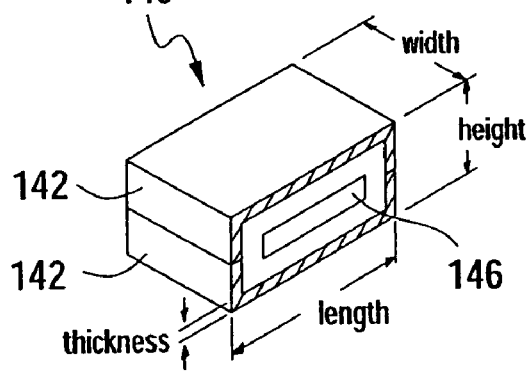
Figure 5C:
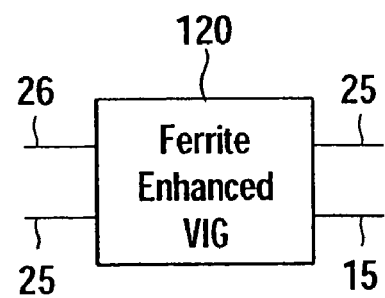
Figure 5D:
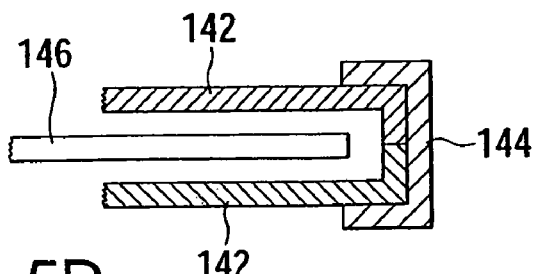

Refer now to FIG. 5B that illustrates a cross section of one of the closed-path ferrites 140. The closed path ferrite 140 preferably is comprised of two C-shaped ferrites 142 forming an aperture that surrounds the fabric 146 (the layers of conductors and insulators) of the conventional VIG 10. The C-shaped ferrites 142 are preferably secured together by end clamps 144. Those skilled in the art would appreciate that the C-shaped ferrites, shown held together with end clamps 144, could be secured together by other fasteners such as bolts or various other types of clamps and the like. The dimensions of the aperture formed by the joining of the two C-shaped ferrites are consistent with the dimensions of the VIG 10. The addition of one or more closed-path ferrites 140 to a VIG 10 preferably provides the ferrite VIG 120 in accordance with the present invention. FIG. 5D is a cross section of one end of an exemplary closed-path ferrite shown in FIG. 5A. Other arrangements of magnetic materials that provide a closed path for the magnetic flux of the ferrite VIG 120 would fall within the scope of the present invention.

The ferrite VIG 120 has several characteristics that distinguish it from the conventional VIG 10. Since the closed-path ferrite 140 of the ferrite VIG 120 contains much of the magnetic flux and energy resulting from the associated current pulses, there is less magnetic flux within the circular core or mandrel to interfere with electronic devices. Hence electronic devices, printed circuit boards with components, placed inside the ferrite VIG 120 are in an environment with less electromagnetic interference. Further, the one or more ferrites, which may have a relative permeability of greater than 1000, provide a much greater inductance for the passive transmission line or slow side of the ferrite VIG 120. Because of the greater inductance provided by the one or more closed-path ferrites 140, the electric field decay time in the slow side of the ferrite VIG 120 is greater, which suggests that the voltage efficiency and energy efficiency of the ferrite VIG are increased when compared to the conventional VIG 10. Further, by varying the number and size of the one or more closed-path ferrites, the frequency of the slow side may be adjusted or tuned to take on a variety of values. The utilization of the one or more closed-loop ferrites provides a new degree of freedom for use in VIG design. In addition, the shape of the ferrite VIG 120, unlike the essentially circular VIG 10 of the prior art, may have a variety of shapes without significantly sacrificing voltage efficiency. One such shaped device is substantially planar VIG that will be discussed later in more detail. Also, the introduction of closed-path ferrites 140 may be used to improve the efficiency of an existing VIG 10 of the prior art. The use of closed-path ferrites 140 has added a new design parameter for high-voltage generators comprised of wound layers of conductors and dielectrics which would be appreciated by those skilled in the art upon reading this disclosure. The benefits of closed-path ferrites will be further understood through nonlimiting examples and performance comparisons in the additional figures and discussions that follow. A block diagram of the ferrite VIG 120 of FIG. 5A is shown in FIG. 5C having an input port comprising ends 25, 26 for coupling to the source voltage, Vs, and the short circuit switch 20. An output port, comprising ends 25, 15, is available for supplying a high-voltage to a load or high-voltage device.

An improvement in voltage efficiency of the ferrite VIG 120 is illustrated in FIG. 6. The output of the ferrite VIG 120, represented by ferrite curve 170, has a peak value of 12.3 kV (shown as negative 12.3 kV). Before three closed-path ferrites of the ferrite VIG 120 were placed about the conventional VIG 10, the peak output voltage is 8.3 kV (shown as negative 8.3 kV on conventional curve 160). The performance curves of FIG. 6 illustrate that the addition of closed-path ferrites 140 may be used to improve both voltage and energy efficiency (since energy is proportional to voltage squared) of an existing conventional VIG 10.

A ferrite VIG 120 performance table 70 illustrating the frequency variations of the fast side and the slow side of a ferrite VIG is shown in FIG. 7. The first column 72 shows the number of ferrites is varied from zero to four. A VIG with zero ferrites is a conventional VIG 10. When viewing the second column 74, it should be noted that the oscillatory frequency of the fast side remains fixed. Hence the experimental results show that adding the ferrites does not substantially change the frequency characteristics of the active transmission line 40. However, the oscillatory frequency of the passive transmission line 30 for the ferrite VIG 120, shown in the third column 76, changes from approximately 2.94 MHz (no ferrite) to a lower frequency of approximately 0.84 MHz (four ferrites). The measurements confirm the improvement to a VIG provided by the addition of closed-path ferrites 140. The lower frequency implies that the electric field of the ferrite passive transmission line 40 of the ferrite VIG 120 decays more slowly than the electric field of the passive transmission line of the conventional VIG 10. The last column 78 shows an increase in the ratio of the high frequency to low frequency as a function of the number of ferrites. The inventor has determined that, as the frequency ratio increases, the efficiencies of ferrite VIGs increases. Hence, the frequency ratio may serve as a figure of merit for the ferrite VIGs 120 similar to the diameter to turns ratio used for conventional VIGs 10 as described earlier.

FIG. 8 illustrates a number of ferrite versus frequency ratio plot 80 showing, in graphical form, the relation between the number of ferrites and the frequency ratio. As the number of ferrites increases from zero to four, the frequency ratio asymptotically approach a value of approximately seven. Although, by adding more than four ferrites, there may be some additional performance improvements, there are a variety of ferrite design parameters available that preferably are considered when viewing the graph of FIG. 8. For example, the physical properties of the materials including permeability and permittivity preferably are considered when designing a closed-path ferrite VIGs 120. Further, the dimensions of the ferrites, including width, length, height and material thickness preferably are also considered by those skilled in the design of magnetic circuits.

The passive transmission line for the ferrite VIG 120 may be represented by the slow side 30 of the simplified equivalent circuit of FIG. 3. However the addition of the closed-path ferrites 140 preferably provides a significant increase in the inductance of the inductor, shown as L1, without changing the diameter of the conventional VIG 10. Because the inductance increases, the oscillatory frequency of the slow side of the ferrite VIG 120 decreases thereby allowing the slow side circuit 30 to maintain higher voltages for a longer time than the conventional VIG 10. An illustration of the decrease in oscillatory frequencies caused by the addition of closed-path ferrites was discussed above in relation to FIG. 7. The active transmission line of a ferrite VIG 120 may be represented by the fast side 40 shown in FIG. 3 and generally has parameters similar in values to those of the conventional VIG 10. In general it is preferred to have the oscillatory frequency of slow side 30 much lower than the oscillatory frequency of the fast side 40. The frequency of the fast side is the quarter wave resonance of the "fast side" transmission line.

FIG. 9 illustrates outputs of RF sources when the ferrite VIG 120 is an element of a RF source. The equivalent circuit of FIG. 4 represents the RF source with a load. The inductance of the switch is preferably adjusted by varying the lead length and is shown as L in FIG. 4. For a short lead length the frequency of the RF source is approximately 25 MHz as shown by curve 92. For a long lead length the frequency of the RF source is approximately 10 MHz as shown by curve 94. The inventor has determined that RF sources may have frequencies up to approximately 800 MHz for the arrangement of elements as shown in FIG. 4. The ferrite VIG 120 of the present invention preferably is an element of an RF source.

Before proceeding to demonstrate various benefits of the ferrite VIG 120, it may be helpful to understand the relation between the two-way transit time, $\tau$, of the time varying electric field vector and the time characteristics of the shorting switch 20. FIG. 10 shows an plot 96 of one component of voltage efficiency, $\beta_1$, as a function of the ratio two way transit time to the e-folding time, $\tau_s$, of the switch. The e-folding time of the switch is the time required for the shorting switch 20 to go from an open state to a closed state. It should be noted that keeping the ratio, $\tau/\tau_s$ at a value close to 100 helps to minimize the degradation in efficiency that may be caused by the shorting switch 20.

Examples of switches that may serve as shorting switches is shown in a nonlimiting table of switches 211 depicted by FIG. 11. The table lists the type of switch in a first column 214, indicates the approximate ranges voltages that may be used in a second column 215, indicates a typical maximum current capacity in a third column 218, and indicates a rate of current change in a fourth column 220. The life of the switch is variable, but typically has values as shown in a fifth column 222. Brief application comments are given in a sixth column 224. The list of switches in switch table 211 is not exhaustive and should not be considered a limitation on the present invention.

Materials that may be utilized for the layers of dielectrics 13, 14 are shown in the nonlimiting dielectric table 230 of FIG. 12. A first column 232 provides the names of the materials, a second column 234 has the relative permittivity, $\epsilon_r$, and a third column 236 has the maximum allowed electric field. Comments concerning the use of the materials are provided in column 238. The selection of the dielectric is related to the characteristics of the selected foil and is further dependent on cost and difficulty of fabrication considerations. For most of the laboratory evaluations and experiments, Mylar (not shown in the table) has been used because of its low cost and availability. Because of the large number of materials that may serve as a dielectric for VIGs, the list is considered to be incomplete and should not be considered a limitation on the present invention.

Figure 13B:
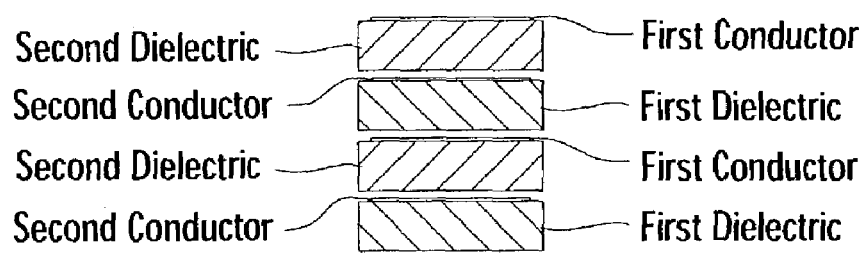

The illustration of the conventional VIG 10 as shown in FIG. 13A represents the above descriptions of the conventional VIG 10. Alternating layers of conductors 11,12 and dielectrics 13, 14 are wound about a circular core that has a mean diameter D. At the inner portion of the layers of windings (ends 15, 16) is a low-voltage port 310, and a high-voltage port 320 is defined by an outside end 25 and inside end 15. A cross section of the conventional VIG 10 is shown in FIG. 13B. The cross section shows alternating layers of conductors and dielectrics with the first conductor appearing at the top, bottom and middle of the layers, i.e., three times, and each of the two dielectrics and the second conductor occurring twice in the layers.

An exemplary illustration of a ferrite VIG 120 in accordance with the present invention is shown in FIG. 14A summarizes the above descriptions of the ferrite VIG 120. Alternating layers of conductors 11,12 and dielectrics 13, 14 are wound about a circular core that has a mean diameter D, just as with the conventional VIG 10. At the outer portion of the layers of windings (ends 25, 26) is a low-voltage port and a high-voltage is defined by an outside end 25 and inside end 15. A single closed-loop ferrite 140 is shown surrounding the layers of conductors and dielectrics. A cross section of the ferrite VIG 120 is shown in FIG. 14B and illustrates the closed-path that the ferrite provides for the magnetic flux.

Figure 14B:
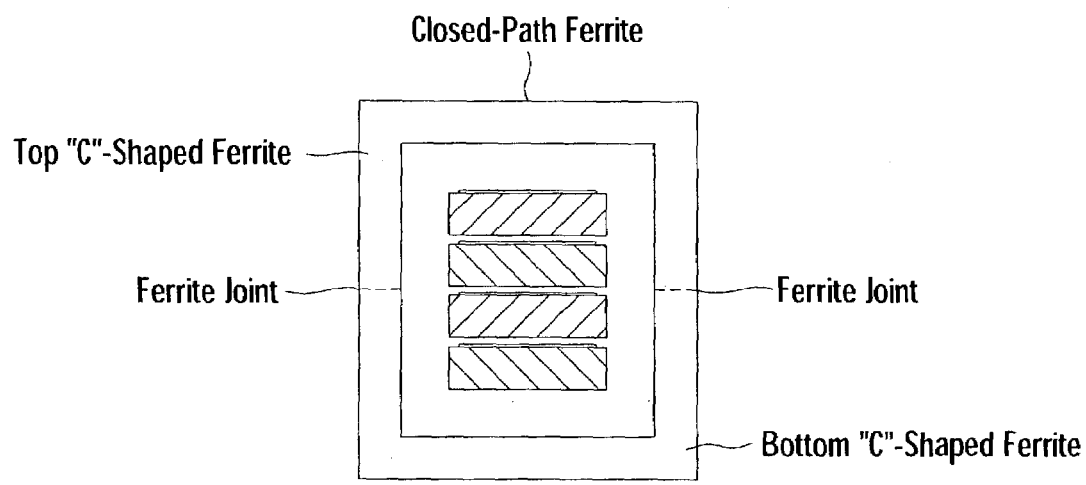

The ferrite VIG 120 as shown in FIG. 14A, 14B may have one or more ferrites. As previously discussed, the inductance in the passive transmission line of the ferrite VIG increases as the number of ferrites increases. Hence, it is possible to significantly reduce the oscillatory frequency of the slow side of the ferrite VIG 120 having an equivalent circuit similar to the circuit 30 shown in FIG. 3 and previously discussed. Because of the new degree of design freedom provided by the addition of ferrites, it is possible to wind VIG fabrics (the layers of conductors and dielectrics) about cores having a variety of shapes.

Figure 15B:
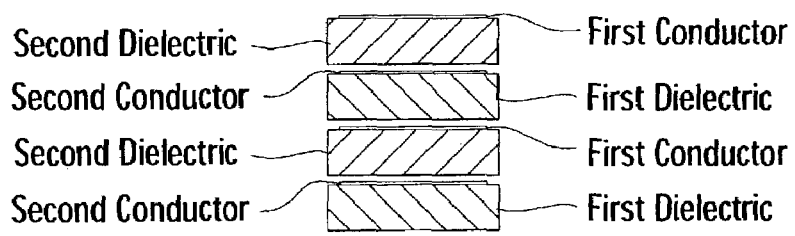

A substantially planar shaped core may be used to fabricate a planar VIG 430, shown without ferrites in FIG. 15 A and having a cross-section shown in FIG. 15B. The substantially planar core may be made of an insulating material that serves as the structure to receive windings of VIG fabric 146. The planar VIG has length, l, and height, h, and the corners are rounded to provide a smooth transition for the VIG fabric as it goes to and from the straight portions of the planar VIG. The low-voltage port 440 is used for a connection a supply voltage and the shorting switch 20 and the high-voltage port 450 serves as an output of a high-voltage pulse. The planar VIG 430, without ferrites, is relatively inefficient, but could be utilized for some applications if efficiency is not an important factor.

The substantially planar VIG 430 of FIG. 15A is preferably modified by placing one or more close-path ferrites about the VIG fabric. FIG. 16A shows a substantially planar ferrite VIG 460 having a single closed-path ferrite and a cross-section view is shown in FIG. 16B. The use of one ferrite typically increase the efficiency of the planar VIG 430. As more ferrites are added, the efficiency, in general, incrementally increases. The number of ferrites that are added is limited by the dimensions of the planar VIG 430 and the size of the closed-path ferrites. Planar VIGs, with and without ferrites, have both size and weight advantages over conventional VIGs 10. However, it is preferable to use ferrites with the planar VIG 430 to obtain an increase in efficiency. The ratio of the length to height for planar VIGs may have a value equal or greater than one. When the ratio is one the shape may be a square with rounded corners. In general, because closed-path ferrites modify and improve the characteristic of VIGs, a variety of geometric shapes may be used for the cross-section of such a generator with no degradation in performance.

For certain applications, it may be desirable to place a VIG, that may be either a conventional VIG 10 or a ferrite planar VIG 460 in an enclosure filled with insulting oil, potting material or the like in order to improve performance of the device. When a ferrite planar VIG 430 is placed in such an enclosure, the reduction in weight advantage is significant when compared to the conventional VIG 10. For example, the weight of a ferrite planar VIG 460 in a closed oil filled container may be one third or more less than the weight of a similarly enclosed conventional VIG 10.

An exemplary method of operation for the ferrite VIG 120 is shown in FIG. 17. First, a supply voltage is applied to the low-voltage port of the ferrite VIG 120, step 710. The supply voltage is connected long enough for the capacitance of the ferrite VIG 120 to be fully charged. After the ferrite VIG 120 is fully charged, a short circuit is provided by a switch closure across the low-voltage port, step 720. The short circuit causes a time varying electric field vector to traverse the active transmission line of the ferrite VIG 120. After a transition time, a high voltage is available on the high-voltage port of the ferrite VIG 120. The high voltage is then coupled to a load, step 730. The load may be any of a variety of devices requiring high-voltage pulses for operation.

FIG. 18 illustrates a high-voltage device 400 having the ferrite VIG 120 coupled to a high-voltage element 480. The high voltage element 480 may be an antenna, an X-ray tube, or other device that requires a high-voltage source for operation. For some applications, it may be desirable to use the planar ferrite VIG 460 in place of ferrite VIG 120 because of its reduced size. Control circuits 490 are preferably coupled to both the ferrite VIG 140 and the high-voltage element 480 for controlling the operation of the high-voltage device 400.

FIG. 19 illustrates the use of two ferrite planar VIGs 460 coupled to an X-Ray tube 482 and control circuits. Such an arrangement provides a portable X-Ray Machine that is smaller and lighter than existing machines. The savings in weight and size is provided by the improved efficiency of closed-path ferrites of the present invention.

While the invention has been described in detail, it is to be expressly understood that it will be apparent to persons skilled in the relevant art that the invention may be modified without departing from the spirit of the invention. Various changes of form, design or arrangement may be made to the invention without departing from the spirit and scope of the invention. Therefore, the above mentioned description is to be considered exemplary, rather than limiting, and the true scope of the invention is that defined in the following claims.

What is claimed is:

1. A method for modifying the characteristics of a high-voltage generator, the method comprising the steps of:
providing a vector inversion generator (VIG) having windings of layered conductors and dielectrics; and
surrounding a section of the windings with a closed-path ferrite; and placing additional separate closed-path ferrites about other sections of the windings until a desired value for a parameter of the VIG is obtained.

2. The method of claim 1, wherein each of the closed-path ferrites is comprised of a first C-shaped ferrite attached to a second C-shaped ferrite, the first and second C-shaped ferrites forming an opening through which the windings pass.

3. The method of claim 1, wherein the VIG is cylindrical.

4. The method of claim 1, wherein the VIG is planar.

5. The method of claim 1, wherein the parameter is an efficiency of the VIG.

6. The method of claim 1, wherein the parameter is a frequency of the VIG.

7. The method of claim 1, wherein the VIG has a first rounded section, a second rounded section, and at least one non-rounded section extending between the first and second rounded sections.

8. The method of claim 1, wherein the VIG has an outer surface, an inner surface having an edge, and an edge surface extending between the outer surface and the inner surface, the inner surface defining an aperture in the VIG through which each of the closed-path ferrites extends, wherein a maximum length of the VIG in a first direction is greater than a maximum length of the VIG in a second direction, wherein the directions are orthogonal and are parallel to a plane defined by the edge of the inner surface.

9. An apparatus for generating a high voltage, comprising:
a voltage inversion generator (VIG) of wound fabric having alternating layers of conductors and dielectrics; and
a plurality of separate closed-path ferrites, each of the closed-path ferrites surrounding a respective section of the wound fabric.

10. The apparatus of claim 9, wherein each of the closed-path ferrites is comprised of a first C-shaped ferrite attached to a second C-shaped ferrite.

11. The apparatus of claim 9, wherein the VIG is cylindrical with a mean diameter at least ten times a thickness of the wound fabric.

12. The apparatus of claim 9, wherein the VIG is planar.

13. The apparatus of claim 9, wherein the VIG has an outer surface, an inner surface having an edge, and an edge surface extending between the outer surface and the inner surface, the inner surface defining an aperture in the VIG through which each of the closed-path ferrites extends, wherein a maximum length of the VIG in a first direction is greater than a maximum length of the VIG in a second direction, wherein the directions are orthogonal and are parallel to a plane defined by the edge of the inner surface.

14. The apparatus of claim 9, wherein the VIG has a first rounded section, a second rounded section, and at least one non-rounded section extending between the first and second rounded sections.

15. The apparatus of claim 14, wherein a length of the VIG in a first direction is greater than a length of the VIG in a second direction, wherein the first direction is orthogonal to the second direction, and wherein both the first direction and the second direction are parallel to a plane passing through the first and second rounded sections.

16. A method for modifying the characteristics of a high-voltage generator, the method comprising the steps of:
providing a vector inversion generator (VIG) having windings of layered conductors and dielectrics; and
separately mounting a first closed-path ferrite and a second-closed path ferrite on the VIG, the first closed-path ferrite surrounding a first section of the windings and the second closed-path ferrite surrounding a second section of the windings.

17. The method of claim 16, wherein the VIG has a first rounded section, a second rounded section, and at least one non-rounded section extending between the first and second rounded sections.

18. The method of claim 16, wherein the VIG has an outer surface, an inner surface having an edge, and an edge surface extending between the outer surface and the inner surface, the inner surface defining an aperture in the VIG through which each of the closed-path ferrites extends, wherein a maximum length of the VIG in a first direction is greater than a maximum length of the VIG in a second direction, wherein the directions are orthogonal and are parallel to a plane defined by the edge of the inner surface.

* * * * *